United States Patent [19]
Nakasuji

[11] Patent Number: 6,064,071
[45] Date of Patent: May 16, 2000

[54] CHARGED-PARTICLE-BEAM OPTICAL SYSTEMS

[75] Inventor: Mamoru Nakasuji, Yokohama, Japan

[73] Assignee: Nikon Corporation, Tokyo, Japan

[21] Appl. No.: 09/064,978

[22] Filed: Apr. 23, 1998

[30] Foreign Application Priority Data

| Apr. 23, 1997 | [JP] | Japan | 9-105791 |
| Apr. 23, 1997 | [JP] | Japan | 9-105792 |
| Apr. 23, 1997 | [JP] | Japan | 9-105793 |

[51] Int. Cl.[7] .................................................. H01J 37/30
[52] U.S. Cl. ............. 250/492.23; 250/398; 250/396 ML
[58] Field of Search ................... 250/492.23, 492.22, 250/398, 396 R, 396 ML

[56] References Cited

U.S. PATENT DOCUMENTS 5,633,507  5/1997  Pfeiffer et al. ..................... 250/492.23

OTHER PUBLICATIONS

Hosokawa, "Systematic elimination of third order aberrations in electron beam scanning system" *Optik* 56 No. 1 (1980) pp. 21–30.

*Primary Examiner*—Kiet T. Nguyen
*Attorney, Agent, or Firm*—Klarquist Sparkman Campbell Leigh & Whinston, LLP

[57] ABSTRACT

Charged-particle optical systems are disclosed for transferring high-resolution patterns from a mask to a wafer. One embodiment comprises a symmetric magnetic doublet lens and a plurality of deflectors. The deflectors satisfy variable axis lens (VAL) conditions and establish an effective optical axis. The deflectors also deflect the charged-particle beam so that a principal ray coincides with the effective optical axis. Symmetry conditions are provided for the symmetric magnetic doublet and the deflectors. In another embodiment, deflectors use a common series current.

48 Claims, 6 Drawing Sheets

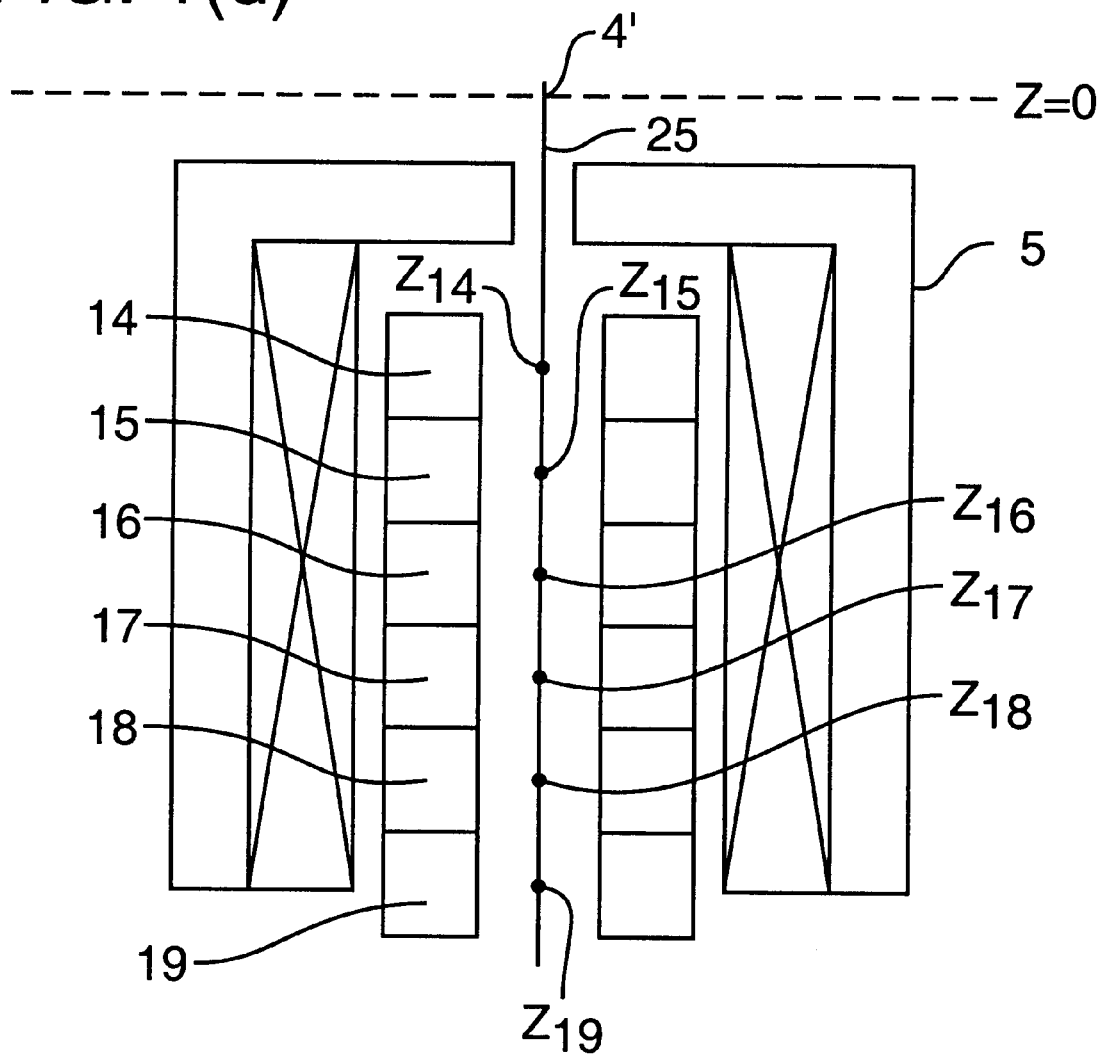

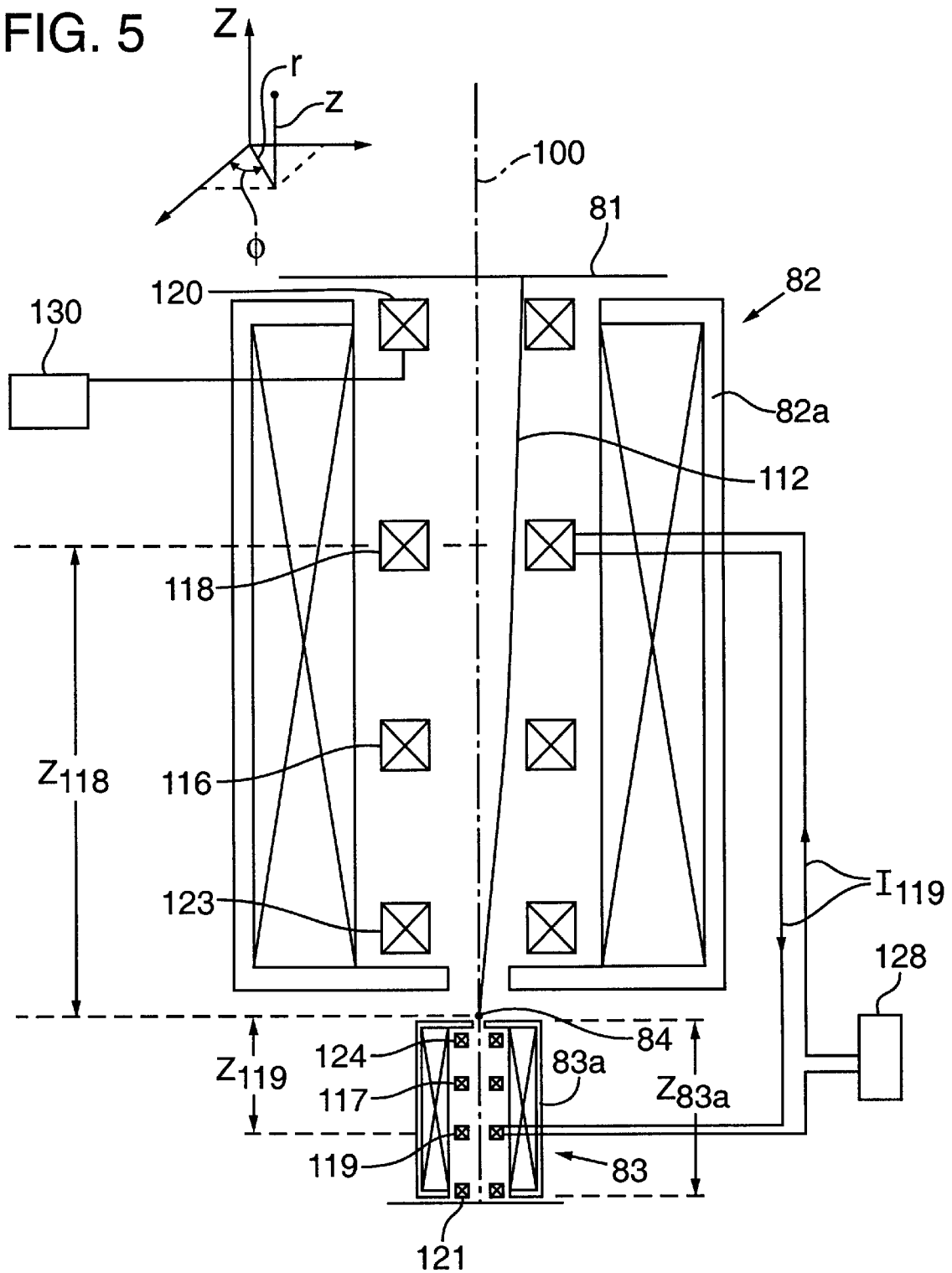

CHARGED-PARTICLE-BEAM OPTICAL SYSTEMS

FIELD OF THE INVENTION

The invention pertains to charged particle optical systems for transferring patterns from a mask to a wafer or other substrate.

BACKGROUND OF THE INVENTION

Several types of charged-particle-beam (CPB) optical systems have been developed for high-resolution microlithography. These include the symmetrical magnetic doublet, described in, for example, M. B. Heritage, "Electron-Projection Microfabrication System," J. Vac. Sci. Technol. 12, pp. 1135–1140 (1975), the moving objective lens ("MOL") system, described in, for example, H. Ohiwa, "Design of Electron-Beam Scanning System Using the Moving Objective Lens," J. Vac. Sci. Technol. 15, pp. 849–85 (1978). Other CPB optical systems include the variable axis lens ("VAL") system discussed in, for example, H. C. Pfeiffer et al., "Variable Axis Lens for Electron Beams," Appl. Phys. Lett. 39, pp. 775–776 (1981) and the projection exposure with variable axis immersion lenses ("PREVAIL") system as described in, for example, H. C. Pfeiffer, "Projection Exposure with Variable Axis Immersion Lenses: A High-Throughput Electron Beam Approach to 'Suboptical' Lithography," Japan. J. Appl. Phys. (Part 1) 34, pp. 6685–6662 (1995) (hereinafter "Pfeiffer").

Because of aberrations in CPB optical systems, the entire pattern required for a complex integrated circuit such as a memory chip cannot be projected from a mask to a wafer in a single exposure. Therefore, the mask containing the circuit pattern is divided into fields containing circuit patterns for a single chip or die. The fields are further divided into subfields such that the CPB optical system aberrations are acceptable for projection of these subfields. Images of the subfields are then individually and sequentially projected onto the sensitized wafer and joined together so that an image of the complete pattern is formed. The images of the subfields are joined by combining mechanical scanning of the mask and/or wafer and deflection of the image formed by the charged-particle beam.

With a symmetric magnetic doublet, aberrations on the optical axis and over a large field of view tend to be small. However, field curvature and astigmatism are large and can seriously degrade the images formed, especially for large lens apertures. If the lens apertures are small, then the interactions of the charged particles with each other (e.g., electron-electron interactions) in the charged-particle beam degrade the images. If the current density is reduced in order to avoid electron-electron interactions, then throughput decreases. As a result, the symmetric magnetic doublet is unable to simultaneously provide high resolution and high throughput.

In the VAL, PREVAIL, and MOL systems, the location of the optical axis is effectively shifted so that the charged-particle beam propagates along an effective optical axis even for off-axis points. Large apertures and small aberrations can be achieved and throughput is high. For example, in the PREVAIL system of Pfeiffer, deflectors are provided that produce supplemental magnetic fields so that the total magnetic field encountered by electrons propagating off-axis is approximately the same as the magnetic field near the optical axis. In this way, the field of view of the CPB optical system is increased. The supplemental magnetic fields satisfy conditions so as to create an effective optical axis that is displaced from the optical axis. As a result, off-axis field points are imaged with aberrations of the same magnitude as an on-axis point.

In these systems, a single deflector directs the charged-particle beam through a crossover aperture on the optical axis of a first lens and a single deflector redirects the charged-particle beam received from the crossover so that the beam propagates parallel to the optical axis of a second lens. These deflectors must produce large deflections. If the effective optical axis is displaced a large distance from the optical axis, deflection aberrations become significant.

Pfeiffer shows an exemplary PREVAIL system in which axis-shifting deflectors create an effective optical axis displaced from the optical system. The electron beam propagates along the effective optical axis of a condenser lens that directs the electron beam to the mask; projection lenses image the mask onto the wafer. Subfield-selection deflectors direct the electron beam so that a selected mask subfield is irradiated and direct the image of the mask subfield onto a corresponding transfer subfield of the wafer.

The PREVAIL system has several significant limitations. In the PREVAIL system, imaging errors caused by electron-electron interactions are reduced to some extent by reducing the distance between the mask and the wafer. Generally, however, the mask-wafer distance is still too large and charged-particle interactions limit image resolution. In addition, if the distance between the positioning deflectors and the aperture stop is small, then large deflections are required, resulting in large deflection aberrations. If the distances are reduced to control deflection aberrations, then the axis-shifted lens must be shorter, thereby increasing on-axis lens aberrations. The subfield-selection deflectors must be precisely controlled and a well regulated power supply is necessary to drive these deflectors. Because the power supply must be precisely controlled, these deflectors cannot be used for rapid repositioning of the electron beam.

Although the aberrations of the lenses used in the MOL, VAL, VAIL, and PREVAIL systems are improved, aberrations caused by manufacturing errors of the deflectors are not eliminated and these systems exhibit large distortions. As a result, none of these systems are suited for the production high-density integrated circuits such as dynamic random-access memory (DRAM) of 4 Gbit or more.

Therefore, apparatus and methods are needed for transferring patterns from a mask to a sensitized substrate with increased resolution and high throughput. In particular, a CPB optical system is needed that can project a large subfield with low levels of aberrations and that has reduced sensitivity to manufacturing errors.

SUMMARY OF THE INVENTION

An object of the invention is to provide improved charged-particle-beam (CPB) optical systems that have small aberrations due to both lens and deflector aberrations.

Another object of the invention is to provide CPB optical systems having a short mask-wafer distance, reduced charged-particle interactions, and rapidly adjustable deflections.

According to one aspect of the invention, a CPB optical system for projecting patterns from a mask with a demagnification 1/M onto a sensitized wafer or other substrate comprises a condenser lens situated to receive a charged-particle beam and direct the charged-particle beam to the mask, and a first projection lens situated to receive the charged-particle beam from the mask and form a crossover. The condenser lens and the first projection lens produce magnetic fields having axial components that are in a first direction. A crossover aperture is situated to receive the crossover. A second projection lens receives the charged-particle beam from the crossover aperture and directs the charged-particle beam to the wafer. An immersion lens is situated so that the wafer is between the immersion lens and the second projection lens. The immersion lens and second projection lens produce magnetic fields of which the axial components are in a second direction opposite the first direction. A plurality of deflectors are provided between the mask and wafer. The deflectors are activatable to deflect the electron beam and establish an effective optical axis. When the deflectors are activated, a principal ray from an off-axis point on the mask coincides with the effective optical axis and passes through the center of the crossover aperture.

The plurality of deflectors can comprise equal numbers of deflectors between the crossover and the reticle and between the crossover and the wafer. The ratio of the distance from the mask to the crossover and the distance from the crossover to the wafer is preferably M.

In another embodiment of a CPB optical system according to the invention, the radial distance of the principal ray from the axis is $r=R'(z)$ with the deflectors activated, and the radial distance of the principal ray is $r=R(z)$ when the deflectors are not activated, wherein $R(z)=R'(z)$. Preferably, the principal ray is perpendicular to the mask at the mask and perpendicular to the wafer at the wafer.

The azimuthal coordinate $\phi(z)$ of the principal ray with the deflectors activated is equal to the azimuthal coordinate $\phi'(z)$ when the deflectors are unactivated, i.e., $\phi(z)=\phi'(z)$.

In another embodiment of a CPB optical system, a current source provides a series current to the first projection lens and the second projection lens.

In another embodiment, the patterns are projected from the mask onto the sensitized substrate with a demagnification 1/M and a principal plane of the first projection lens and a principal plane of the second projection lens are offset by distances $M\Delta z$ and $-\Delta z$, respectively, from symmetric magnetic doublet positions.

The first projection lens and the second projection lens preferably form a symmetric magnetic doublet (SMD). The ratio of the distance from the mask to the crossover and the distance from the crossover to the wafer is preferably M.

According to another embodiment of a CPB optical system, according to the invention, for transferring patterns from a mask to a wafer with a demagnification of 1/M, the optical system comprises, from object-wise to image-wise along an axis, a first lens and a second lens. The first lens forms a crossover. The ratio of the axial distances from the mask to the crossover and from the crossover to the wafer is M. The optical system further comprises a set of K or more object-wise deflectors situated along the axis between the mask and the crossover ($K \geq 1$) and a set of K image-wise deflectors situated along the axis between the crossover and the wafer. The image-wise deflectors and the object-wise deflectors are operable to establish an effective optical axis displaced from the axis. The object-wise and image-wise deflectors are operable so that deflection aberrations produced by the deflectors approximately cancel the aberrations of the first and second lenses. Preferably, $K \geq 3$. In another embodiment, the first lens and the second lens are displaced from symmtric magnetic doublet conditions by $M\Delta z$ and $-\Delta z$, respectively.

The first lens can comprise a pole piece having object-wise and image-wise bore diameters and the second lens can comprise a pole piece having object-wise and image-wise bore diameters. The bore diameters of the first lens are preferably no larger than twice the diameter of the mask field and the bore diameters of the second lens are preferably no larger than twice the diameter of the transfer field.

The axial distance between the object-wise and image-wise bores of the first lens is preferably less than or equal to two times the larger of the object-wise and image-wise bore diameters of the first lens. The axial distance between the object-wise and image-wise bores of the second lens is preferably less than or equal to two times the larger of the object-wise and image-wise bore diameters of the second lens.

The object-wise deflectors and the image-wise deflectors can be operable to deflect the charged particle beam. A current source is provided to supply a series current to at least one deflector of the object-wise set and at least one deflector of the image-wise set. According to another embodiment, a current source is provided so that the first projection lens and the second projection lens receive a series current.

The object-wise deflectors can comprise, from object-wise to image-wise, deflectors 1 through K and the image-wise deflectors can comprise, from image-wise to object-wise, deflectors 1 through K, wherein the Jth object-wise deflector and the Jth image-wise deflector ($1 \leq J \leq K$) are symmetric.

A current source can be provided whereby the ampereturn (AT) values of the Jth object-wise deflector and the Jth image-wise deflector are equal in magnitude and produce oppositely directed deflections, thereby reducing deflection aberrations.

The first lens can comprise a pole piece having object-wise and image-wise bore diameters and the second lens can comprise a pole piece having object-wise and image-wise bore diameters. The bore diameters of the first lens are preferably no larger than twice the diameter of the mask field and the bore diameters of the second lens are preferably no larger than twice the diameter of the transfer field. The object-wise bore diameter of the first lens can be less than or equal to 1.5 times the image-wise bore diameter of the first lens and the image-wise bore diameter of the second lens can be less than or equal to 1.5 times the object-wise bore diameter of the second lens.

The first and second lenses preferably form a symmetric magnetic doublet with respect to their respective bores, lens excitations AT, and magnetic fields produced by the lenses. Some embodiments satisfy additional conditions that the axial distance between the object-wise and image-wise bore diameters of the first lens be less than or equal to two times the larger of the object-wise and image-wise bore diameters, and that the axial distance between the object-wise and image-wise bores of the second lens be less than or equal to two times the larger of the object-wise and image-wise bore diameters.

According to yet another embodiment, a CPB optical system comprises, from object-wise to image-wise along an axis, a first projection lens and a second projection lens. The first projection lens comprises a pole piece having an object-wise bore and an image-wise bore. The first projection lens forms a crossover, and a crossover aperture is situated to receive the crossover; the ratio of the axial distance from the mask to the crossover and the axial distance from the crossover to the wafer is preferably M. The second projection lens comprises a pole piece having an object-wise bore and an image-wise bore. Preferably, either the ratio of the object-wise bore diameter of the first projection lens and the image-wise bore diameter of the second projection lens is M, or the ratio of the axial length of the pole piece of the first projection lens to the axial length of the pole piece of the second projection lens is M. A plurality of deflectors is situated between the mask and the crossover aperture. The deflectors generate magnetic fields establishing an effective optical axis and deflect the charged-particle beam so that an off-axis principal ray coincides with the effective optical axis and intersects the center of the crossover aperture. Preferably, the principal ray is perpendicular to the mask at the mask and perpendicular to the wafer at the wafer.

The image-wise bore diameter of the first projection lens is preferably less than one-half the object-wise bore diameter of the first projection lens, and the object-wise bore diameter of the second projection lens is preferably less than one-half the image-wise bore diameter of the second projection lens.

A CPB optical system according to yet another embodiment comprises a first projection lens having an object-wise bore diameter and an image-wise bore diameter. The first projection lens forms a crossover, wherein the ratio of the axial distance from the mask to the crossover and from the crossover to the wafer is preferably M. The system also comprises a second projection lens having an object-wise bore diameter and an image-wise bore diameter. The second projection lens is situated to receive the charged particle-beam from the crossover. Preferably, the ratio of the object-wise bore diameter of the first projection lens to the image-wise bore diameter of the second projection lens is M, the ratio of the image-wise bore diameter of the first projection lens to the object-wise bore diameter of the second projection lens is M, and the ratio of the axial distances between the lengths of the first and second projection lenses is M. A first deflector is situated object-wise of the first projection lens and produces a magnetic field that establishes an effective optical axis. The first deflector also produces a magnetic field that deflects the charged-particle beam so that an off-axis principal ray from a subfield intersects the crossover and coincides with the effective optical axis. The system also preferably comprises an object-wise set of J (J≧2) deflectors. The object-wise set comprises, from object-wise to image-wise, deflectors 1, . . . , J. and is situated between the first deflector and the crossover. The object-wise set generates a magnetic field establishing an effective optical axis that coincides with the principal ray. The system also preferably comprises an image-wise set of J' (J'≧2) deflectors. The image-wise set comprises, from image-wise to object-wise, deflectors 1, . . . , J', and is situated between the crossover and the wafer. The image-wise set generates a magnetic field establishing an effective optical axis that coincides with the principal ray.

Each of the deflectors of the object-wise set is preferably operable to produce an equal deflection and each of the deflectors of the image-wise set is preferably operable to produce an equal deflection. Preferably, J=J'. A current source can be provided to supply a series current to the first projection lens and the second projection lens.

A principal plane of the first projection lens and a principal plane of the second projection lens are offset from symmetric magnetic doublet positions by M$\Delta z$ and $-\Delta z$, respectively.

The image-wise bore diameter of the first projection lens is preferably less than one-half the object-wise bore diameter of the first projection lens; and the object-wise bore diameter of the second projection lens is preferably less than one-half the image-wise bore diameter of the second projection lens.

Further preferably, an Nth-most object-wise deflector of the object-wise set and an Nth-most image-wise deflector of the image-wise set are situated so that the ratio of their respective axial distances from the crossover is M, or the ratio of their respective axial lengths is M.

A current source can be provided that supplies a series current to least one deflector of the object-wise set and at least one deflector of the image-wise set.

Further preferably, the ratio of the diameter of an Nth-most object-wise deflector of the object-wise set and the diameter of an Nth-most image-wise deflector of the image-wise set is M. The Nth-most object-wise deflector of the object-wise set and the Nth-most image-wise deflector of the image-wise set preferably receive a series current from a current source. The AT values of the Nth-most object-wise VAL deflector of the object-wise set and the Nth-most image-wise deflector of the image-wise set are preferably equal and opposite to each other.

According to another aspect of the invention, methods are provided for transferring a pattern from an off-axis subfield of a mask to a transfer subfield on a wafer using a charged-particle beam. The method comprises providing a deflection magnetic field to deflect the charged-particle beam along a principal ray; and using a series current to provide a variable-axis magnetic field to establish an effective optical axis that coincides with the principal ray.

The foregoing and other features and advantages of the invention will become more apparent from the following detailed description of example embodiments which proceeds with reference to the accompanying drawings.

BRIEF DESCRIPTION OF THE DRAWINGS

FIG. 1(d) is an elevational sectional view of the magnetic lens of FIG. 1(a).

FIG. 5 is an elevational sectional view of a CPB optical system according to Example Embodiment 4.

DETAILED DESCRIPTION

Figures 1A, 1B, 1C:
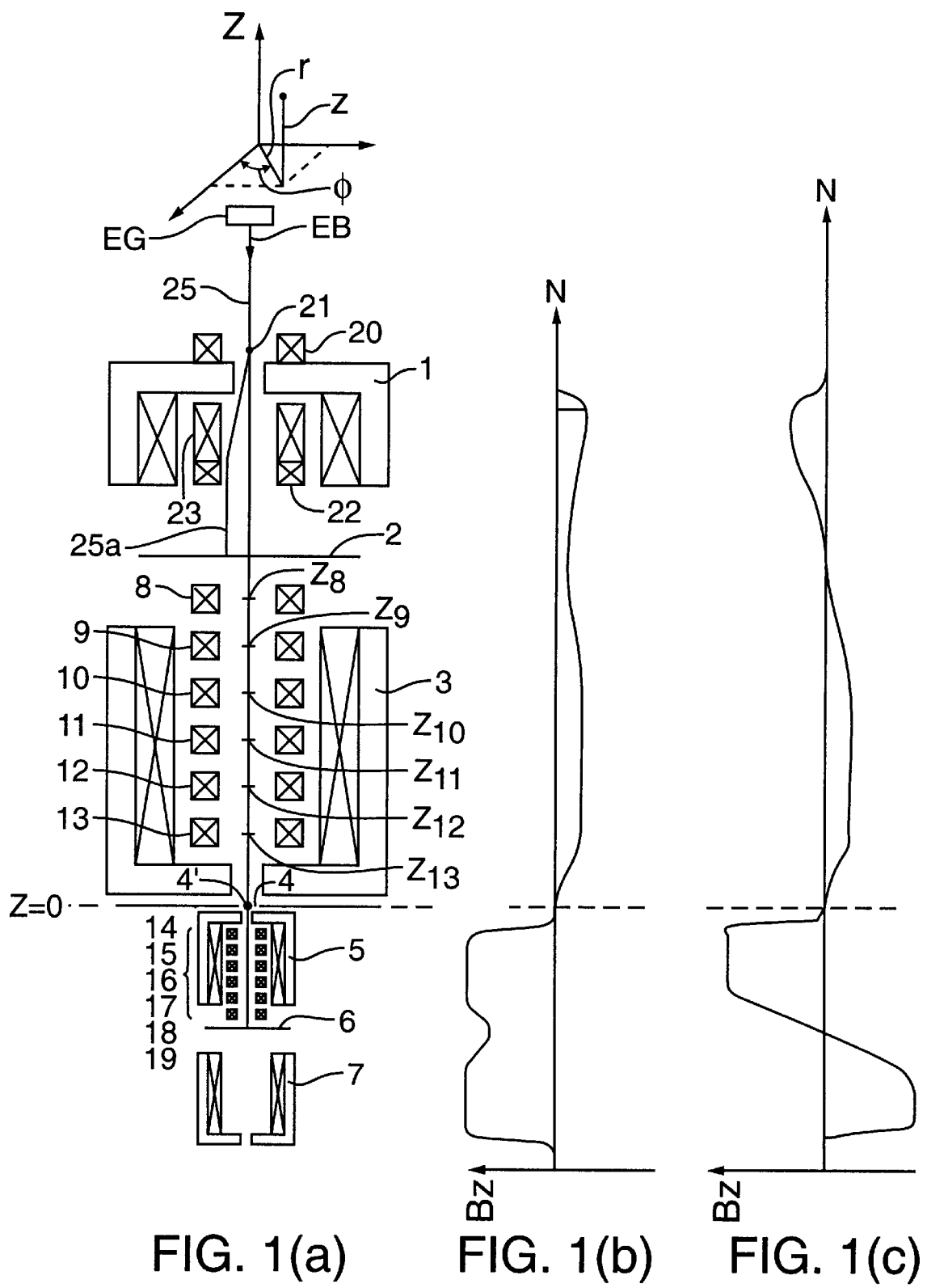
FIG. 1(a) is an elevational sectional view of a charged-particle-beam (CPB) optical system according to Example Embodiment 1.
FIG. 1(b) is a graph of the on-axis axial magnetic field $B_z(0,\phi z)$ produced by the CPB optical system of FIG. 1(a).
FIG. 1(c) is a graph of the on-axis axial magnetic field $B_z(0,\phi z)$ produced by the CPB optical system of FIG. 1(a) with an alternative lens excitation.

For convenience in describing embodiments of the invention, positions along an optical axis closer to a mask (or other object plane) are referred to as "object-wise"; positions along an optical axis closer to a wafer (or other image plane) are referred to as "image-wise." A principal ray is defined as a path of a charged particle in a charged-particle-beam (CPB) optical system from an object to an image through the center of an aperture stop. A portion of a principal ray extending from the mask to the aperture stop is referred to as the object-wise portion; a portion of a principal ray extending from the aperture stop to the wafer is referred to as the image-wise portion.

Embodiments of the invention are described with reference to both rectangular coordinates (x,y,z) and cylindrical coordinates (r,φ,z) in which the mechanical centers of the lenses are arranged along the z-axis. Generally, the mechanical center defines the optical axis of the lens, unless the optical axis of the lens is shifted by an applied field to an "effective optical axis" by a variable axis lens ("VAL"). VAL conditions are summarized as follows. For a magnetic lens having a lens optical axis, the on-axis axial component of the magnetic field as a function of position along the axis is $B_z(0,φ,z)$ and the radial component of the magnetic field is $B_r(r,φ,z)$. To create an "effective optical axis" shifted a distance $r_0$ from the z-axis (the optical axis), a VAL magnetic field is supplied having a radial magnetic field component given by:

$$B_{rVAL}(z) = \frac{1}{2} r_0 \frac{d B_z(0, \phi, z)}{dz}$$

Deflectors that produce such field components are referred to as VAL deflectors. A VAL deflector is used to produce such a field component to create an effective optical axis and not to deflect a charged-particle beam.

The CPB optical systems of the example embodiments of this invention project an image of a mask onto a wafer or other substrate. In order to reduce the effect of optical aberrations on the projected images, the mask is divided into smaller regions containing circuit patterns for a single chip or die. These regions are referred to herein as "fields." The fields are divided into smaller regions referred to herein as "subfields." The patterns contained in the fields and subfields are projected by the optical systems onto corresponding "transfer fields" and "transfer subfields" on the wafer. Images of the mask subfields are projected one at a time onto corresponding transfer subfields on the wafer. The transfer subfields are joined or "stitched" together by a combination of mask or wafer translation and deflections of the images of the mask subfields. A more complete description of the division of the mask into subfields is contained in, for example, Japanese patent document No. Hei 07-338372.

Example embodiments are disclosed below that comprise a symmetric magnetic doublet ("SMD") that forms a demagnified image of a mask subfield on a wafer with a demagnification 1/M. The factor "M" is referred to as the magnification factor. The SMD comprises an object-wise magnetic lens and an image-wise magnetic lens and satisfies the following SMD conditions:

First, the object-wise focal plane of the object-wise lens of the SMD is located at the mask or other object plane and the image-wise focal plane of the image-wise lens is located at the wafer or other image plane.

Second, the object-wise lens and the image-wise lens are symmetric about a beam crossover (aperture stop). If the dimensions of the image-wise lens are multiplied by the magnification factor M, then the object-wise and image-wise lenses would have the same dimensions. The locations of the object-wise and image-wise lenses are also symmetric. If the distance from the image-wise lens to the crossover is multiplied by the magnification factor M, then the distance would be the same as the distance from the object-wise lens to the crossover. Other distances between the image-wise lens and the crossover are also preferably equal to corresponding distances of the object-wise lens from the crossover when multiplied by the magnification factor M.

Third, the two lenses respective comprise lens coils that are driven such that the product of the number of turns in the object-wise coil and the current in the object-wise coil is equal to the product of the number of turns in the image-wise coil and the current in image-wise coil. The product of the number of turns in a coil and the current in the coil is referred to herein as the "Ampere-turns value" or "AT value." The respective electrical currents in the coils of the object-wise and image-wise lenses of an SMD are arranged so that their AT values are equal and so that the lenses produce oppositely directed axial magnetic field components.

Example Embodiment 1

Example Embodiment 1 is described using a cylindrical coordinate system (r,φ,z) as illustrated in FIG. 1(a). The CPB pattern-transfer apparatus of FIG. 1(a) comprises an electron gun EG that produces an electron beam EB. A condenser lens 1 situated along an optical axis 25 receives the electron beam EB from a crossover 21 and directs the electron beam EB to a mask 2. A first projection lens 3 receives the electron beam from the mask 2 and forms a crossover 4'. The first projection lens 3 produces an axial magnetic field component $B_z$ that is in the same direction as an axial magnetic field $B_z$ produced by the condenser lens 1. A second projection lens 5 receives the electron beam EB from the crossover 4' and images the mask 2 onto a wafer 6. An immersion lens 7 is situated downstream of the wafer 6 with respect to the lens 5. In this embodiment, the mask 2 is imaged onto the wafer 6 with a demagnification of 1/M=1/3.

The on-axis axial magnetic field components $B_z(0,φ,z)$ produced by the lenses 5, 7 are in a direction opposite to the axial field components $B_z(0,φ,z)$ produced by the lenses 1, 3. With reference to FIG. 1(b), the axial magnetic field component $B_z(0,φ,z)$ produced by the lenses of FIG. 1(a) is graphed as a function of z.

The mask 2 defines patterns to be transferred to the wafer 6 and is divided into a plurality of fields each containing a pattern for a single chip or integrated circuit. Each field is divided into multiple subfields, and the pattern portions in the subfields are transferred one at a time to the wafer 6. The pattern portion contained in a single mask subfield is transferred to the wafer 6 in a single exposure. Pattern portions transferred from a plurality of subfields are stitched together on the wafer 6 using a combination of mechanical translations of the mask 2 or the wafer 6 and deflections of the electron beam EB.

With reference to FIG. 1(a), a first subfield-selecting deflector 20 is situated along the optical axis 25 at the crossover 21. The first subfield-deflecting deflector 20 is controlled to deflect the electron beam EB to illuminate a selected subfield of the mask 2. Because the optical axis 25 does not generally intersect the selected subfield, an image of the mask subfield formed by the lenses 3, 5, 7 ordinarily exhibits off-axis lens aberrations. To reduce these aberrations, a variable-axis-lens ("VAL") deflector 23 is provided that produces a VAL magnetic field that establishes an effective optical axis displaced from the optical axis 25. The effective optical axis is an axis shifted away from the optical axis 25 toward the selected mask subfield. The electron beam EB propagates along the effective optical axis with reduced aberrations. By adjusting the magnetic field produced by the VAL deflector 23, the effective optical axis can be straight or curved and its displacement from the optical axis 25 can be varied.

A second subfield-selecting deflector 22 deflects the electron beam EB, deflected by the first subfield-selecting deflector 20, so that the electron beam EB again propagates parallel to the optical axis 25 at the mask 2. After deflection by the subfield-selecting deflectors 20, 22, the electron beam EB illuminates the selected subfield of the mask 2, propagates parallel to the optical axis 25, and is slightly divergent. With reference to FIG. 1(a), the electron beam EB is deflected along a path 25a by the subfield-selecting deflectors 20, 22. With the operation of the VAL deflector 23, the path 25a coincides with an effective optical axis.

Electrons propagating along a principal ray from the selected subfield of the mask 2 propagate toward the wafer 6 along an effective optical axis that is shifted from the optical axis 25 by the deflectors 8–13. The deflectors 9–13 are situated between the first projection lens 3 and the optical axis 25 and the deflector 8 is object-wise of the first projection lens 3. The electron beam EB forms the crossover 4' at a crossover aperture 4. The electron beam EB then propagates along an effective optical axis produced by deflectors 14–19 and is perpendicularly incident to the wafer 6 at a transfer subfield corresponding to the selected mask subfield. The deflectors 14–18 are situated within the second projection lens 5 and the deflector 19 is image-wise of the second projection lens 5. Because the deflectors 9–13, 14–18 are situated within the lenses 3, 5, respectively, the lenses 3, 5 can extend along the axis 25 and need not be short. A long axial extent permits reduction of lens aberrations.

The CPB optical system of FIG. 1(a) is symmetric about the crossover 4', i.e., symmetric about the center of the aperture stop 4. If the object-wise portion of a principal ray is enlarged by the magnification factor M=3, with the intersection of the principal ray and the crossover 4' being fixed, then the crossover 4' is a center of symmetry for the object-wise and image-wise portions of the principal ray. Because of this symmetry, aberrations are small. In addition, the lenses 3, 5 form a SMD.

A principal ray perpendicular to the selected mask subfield and extending through the center of the mask subfield coincides with an effective optical axis as shifted by the deflectors 8–13, 14–19. If the deflectors 8–13, 14–19 are activated, then the radial coordinate r=R(z) of the principal ray is the same as the radial coordinate r=R'(z) of the principal ray without deflection by the deflectors 8–13, 14–19, i.e., R(z)=R'(z). If the condition R(z)=R'(z) is satisfied, then the aberrations of the CPB optical system are small. In addition, if the radial coordinate r=R(z) and the azimuthal angle coordinate $\phi=\Phi(z)$ of the principal ray with the deflectors 8–19 activated are equal to the radial coordinate r=R'(z) and the azimuthal angle coordinate $\phi=\Phi'(z)$, respectively, without activation of the deflectors 8–19 (i.e., if R(z)=R'(z) and $\Phi(z)=\Phi'(z)$), then the aberrations of the CPB optical system are minimized.

The CPB optical system of Example Embodiment 1 also can be operated so that the condenser lens 1 and the first projection lens 3 produce axial magnetic field components $B_z$ in opposite directions such that the axial component of magnetic field at the mask 2 is zero. Similarly, the second projection lens 5 and the immersion lens 7 can produce oppositely directed axial magnetic field components $B_z$ such that the axial magnetic field component $B_z$ at the wafer 6 is zero. With this arrangement of magnetic fields, the object-wise focal plane of the first projection lens 3 is located at the mask 2 and the image-wise focal plane of the first projection lens 3 is located at the crossover 4'. In addition, the object-wise focal plane of the second projection lens 5 is located at the crossover 4' and the image-wise focal plane of the lens 5 is located at the wafer 6.

With reference to FIG. 1(a), each of the deflectors 8, 9, 10, 11, 12, 13 corresponds to one of the deflectors 19, 18, 17, 16, 15, 14, respectively. Because the number of deflectors between the mask 2 and the crossover 4' is the same as the number of deflectors between the crossover 4' and the wafer 6, the optical configuration is symmetric. With reference to FIGS. 1(d) and FIG. 1(a), ratios of the axial distances $z_8/z_{19}=z_9/z_{18}=z_{10}/z_{17}=z_{11}/z_{16}=z_{12}/z_{15}=z_{13}/z_{14}=M=3$. This symmetric arrangement reduces aberrations because deflection aberrations of corresponding deflectors approximately cancel. Radial dimensions of corresponding deflectors (e.g., the deflector pair 8, 19) are also symmetric, so enlarging the radial dimensions of the image-wise deflector of a deflector pair by the magnification factor M produces a deflector with the same dimensions as the object-wise deflector. In addition, if corresponding deflectors in each pair are driven with a series current from a common power supply, deflection variations in the optical system caused by power supply variations are reduced.

In the CPB optical system of FIG. 1(a), the total distance between the mask 2 and the wafer 6 is short so that image blur caused by electron-electron interactions is reduced. Because the deflectors 8–19 are driven so that the optical system is relatively unperturbed by power supply fluctuations, the deflectors can be rapidly adjusted and can be driven with inexpensive power supplies. Expensive, highly stable power supplies are unnecessary.

Example Embodiment 2

Figures 2A, 2B:
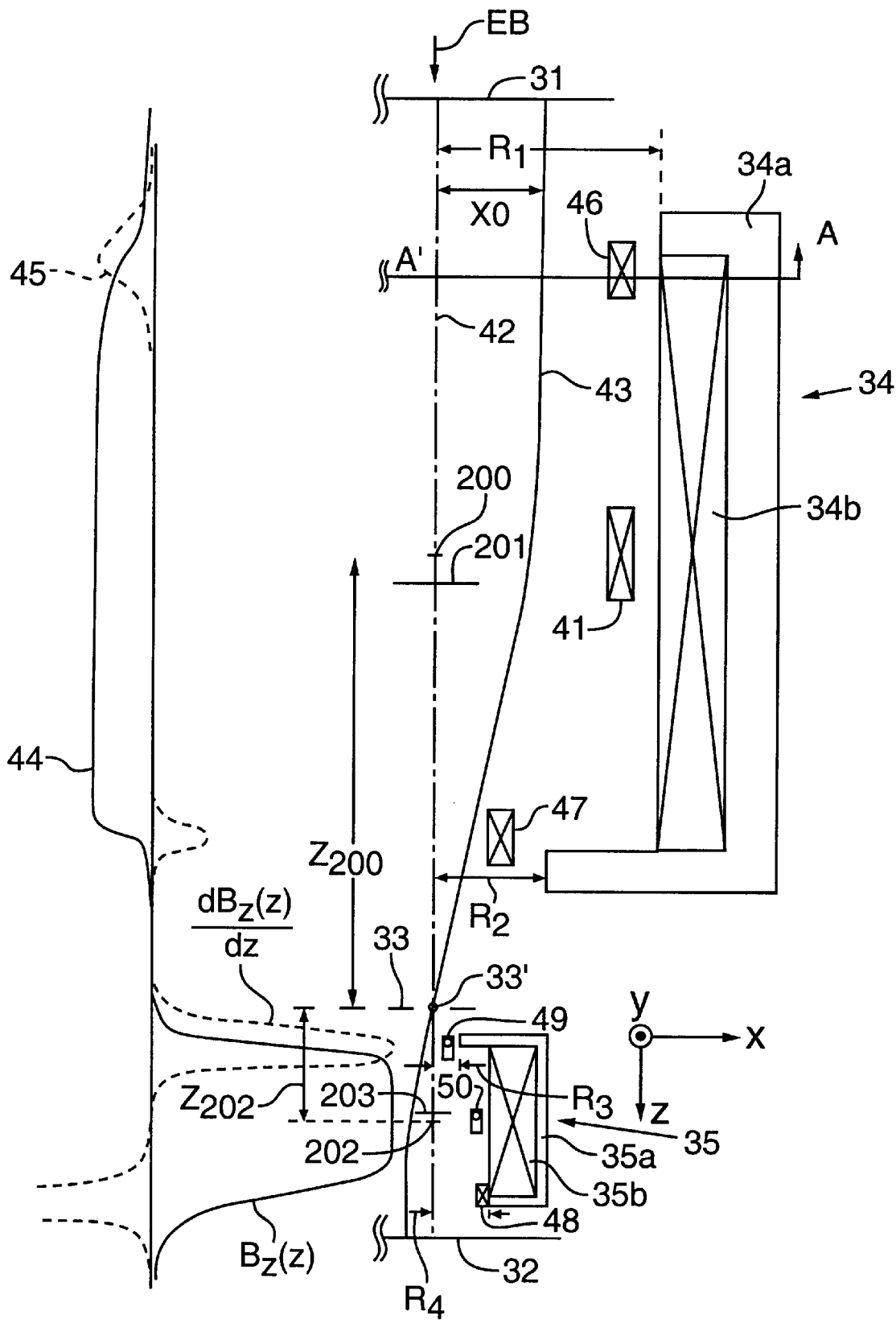
FIG. 2(a) is an elevational sectional view of a CPB optical system according to Example Embodiment 2.
FIG. 2(b) provides graphs of an on-axis axial magnetic field and the first derivative of the on-axis axial magnetic field produced by the CPB optical system of FIG. 2(a).

With reference to FIG. 2(a), a CPB optical system according to Example Embodiment 2 comprises a first projection lens 34 situated on an optical axis 42. The optical axis 42 coincides with a z-axis of a coordinate system. The first projection lens 34 receives an electron beam EB from a mask 31 and forms a crossover 33' at crossover aperture 33. A second projection lens 35 situated on the optical axis 42 receives the electron beam EB from the crossover 33' and images a portion of the mask 31 onto a wafer 32 or other substrate. The lenses 34, 35 satisfy SMD conditions and form a demagnified image of the mask 31 with a demagnification of 1/M=1/4 corresponding to the ratio of the distance from the mask 31 to the crossover 33' and the distance from the crossover 33' to the wafer 32, wherein the distances are measured along the optical axis 42.

The ratios of the axial distances from the crossover 33' to corresponding portions of the lenses 34, 35, respectively, are also M=4. The ratios of corresponding dimensions of the lenses 34, 35, respectively, measured perpendicular to the optical axis 42 are also M=4. In addition, a most image-wise principal plane 201 of the first projection lens 34 is located between the crossover 33' and the mask 31; a most object-wise principal plane 203 of the second projection lens 35 is located between the crossover 33' and the wafer 32. A point 200 divides the mask-crossover distance in half and a point 202 divides the crossover-wafer distance in half. A distance $z_{200}$ between the point 200 and the crossover 33' is M=4 times larger than a distance $z_{202}$ between the crossover 33' and the point 202.

The projection lenses 34, 35 comprise pole pieces 34a, 35a and coils 34b, 35b, respectively. The lenses 34, 35 satisfy SMD conditions and are operated so that the respective AT values of the projection lenses 34, 35 are equal and opposite. The respective directions of current flow in the coils 34b, 35b are arranged so that the projection lenses 34, 35 produce oppositely directed axial magnetic field components $B_z$. With reference to FIG. 2(b), the on-axis (x=y=0) axial magnetic field component $B_z(z)$ and the first derivative of the on-axis axial magnetic field $dB_z(z)/dz$ are shown as curves 44, 45, respectively.

Deflectors 46, 47, 48, 49 are provided to generate magnetic fields satisfying VAL conditions. A subfield of the mask 31 is selected for projection onto the wafer 32. For an illustrative principal ray 43 (i.e., a principal ray from the selected mask subfield) displaced a distance $x_0$ from the optical axis 42, the VAL deflectors 46–49 generate an x-component of magnetic field $B_x(z)$ given by:

$$B_x(z) = -\frac{1}{2} x_0 \frac{dB_z(z)}{dz}$$

where $dB_z(z)/dz$ is shown in FIG. 2(*b*) as a curve 45. With the addition of the VAL field $B_x(z)$, the electron beam EB propagating along the principal ray 43 encounters a magnetic field that is approximately equal to the magnetic field along the optical axis 42. In addition to the VAL deflectors 46–49, deflectors 41, 50 are provided to further reduce aberrations by permitting a gradual deflection of the principal ray 43 away from the mask 31 and toward the wafer 32.

The ratios of corresponding radial dimensions (i.e., dimensions measured perpendicular to the optical axis 42) and the ratio of the axial distances from the crossover 33' are M for each of the corresponding deflector pairs 46, 48 and 41, 50 and 47, 49. The AT values of the deflectors in each pair are equal and the current direction is selected so that the magnetic fields produced by the two deflectors in each pair are in opposite directions.

As illustrated in FIG. 2(*a*), the electron beam EB follows the principal ray 43 from the selected subfield of the mask 34 to the wafer 32. The principal ray 43 can be divided into an image-wise portion, i.e., the portion from the crossover 33' to the wafer 32, and an object-wise portion, i.e., the portion from the mask 31 to the crossover 33'. If the image-wise portion is enlarged by a factor of M=4 about the crossover 33', then the image-wise portion is symmetric with the object-wise portion about the crossover 33'. The crossover 33' is then a center of symmetry for the enlarged image-wise portion and the object-wise portion of the principal ray 43. This symmetry can be described alternatively by observing that a rotation of 180° of the enlarged image-wise portion about an axis through the crossover 33' and parallel to the y-axis superimposes the enlarged image-wise portion and the object-wise portion.

If the maximum field of view of the CPB optical system of Example Embodiment 2 is restricted to a 5-mm radius on the wafer 32, then the image-side bore radius of the second projection lens 35 is $R_4$=10 mm and the object-side bore radius is $R_3$=5 mm. The image-wise bore radius of the first projection lens 34 is $R_2$=4$R_3$=20 mm. The object-wise bore radius of the first projection lens 34 is then $R_1$=4$R_4$=40 mm. For demagnifications 1/M for other than M=4, the corresponding bore radii are multiplied by M instead of 4. In general, superior performance is obtained if the image-wise bore radius $R_4$ of the second projection lens 35 is less than or equal to twice the radius of the image field on the wafer 32. Superior performance is also obtained if the object-wise bore radius $R_1$ of the first projection lens is less than or equal to twice the radius of the object field on the mask 31.

The axial length $z_{34}$ of the first projection lens 34 is selected so that $z_{34} \leq R_1$ or $R_2$, whichever is larger. The axial length $z_{35}$ of the second projection lens 35 is selected so that $z_{35} \leq R_3$ or $R_4$, whichever is larger. In addition, the lenses 34, 35 exhibit superior performance if the image-wise and object-wise bore radii $R_2$, $R_1$ of the first projection lens 34 satisfy the condition $R_2 \leq R_1/1.5$. Superior performance is also obtained if the bore radii $R_3$, $R_4$ of the second projection lens 35 satisfy the condition $R_3 \leq R_4/1.5$. Superior performance is also obtained if three or more deflectors are situated object-wise of the crossover 33 and corresponding deflectors are situated image-wise of the crossover 33'.

Figure 3:
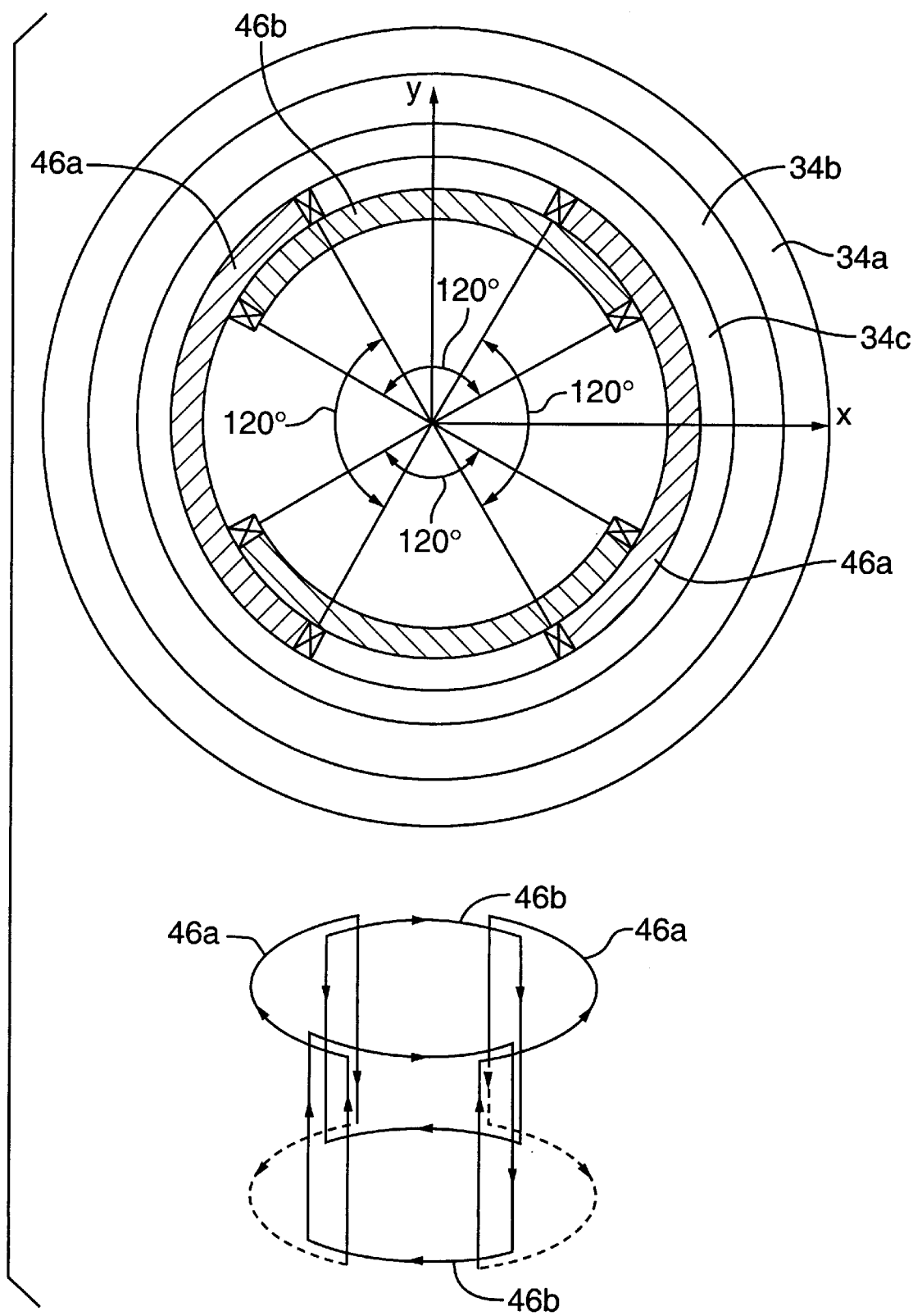
FIG. 3 is a sectional view of a deflector of the FIG. 2(a) embodiment.

With reference to FIG. 3, the deflector 46 comprises a VAL deflector 46*a* and a beam deflector 46*b*. The VAL deflector 46*a* provides a magnetic field according to VAL conditions so that the electron beam EB propagating along an off-axis path such as the principal ray 43 encounters magnetic fields similar to those on the optical axis 42. The beam deflector 46*b* deflects the electron beam EB so that the path 43 is a principal ray. The deflectors 46*a*, 46*b* comprise, for example, saddle-shaped coils. The deflectors 46*a*, 46*b* subtend angles of 120° about the optical axis 42. The lens 34 surrounds the deflector 46 and comprises a coil 34*a* and a pole piece 34*b* of a ferromagnetic material. An air gap 34*c* separates the coil 34*a* from the deflectors 46*a*, 46*b*.

Example Embodiment 3

Figure 4:
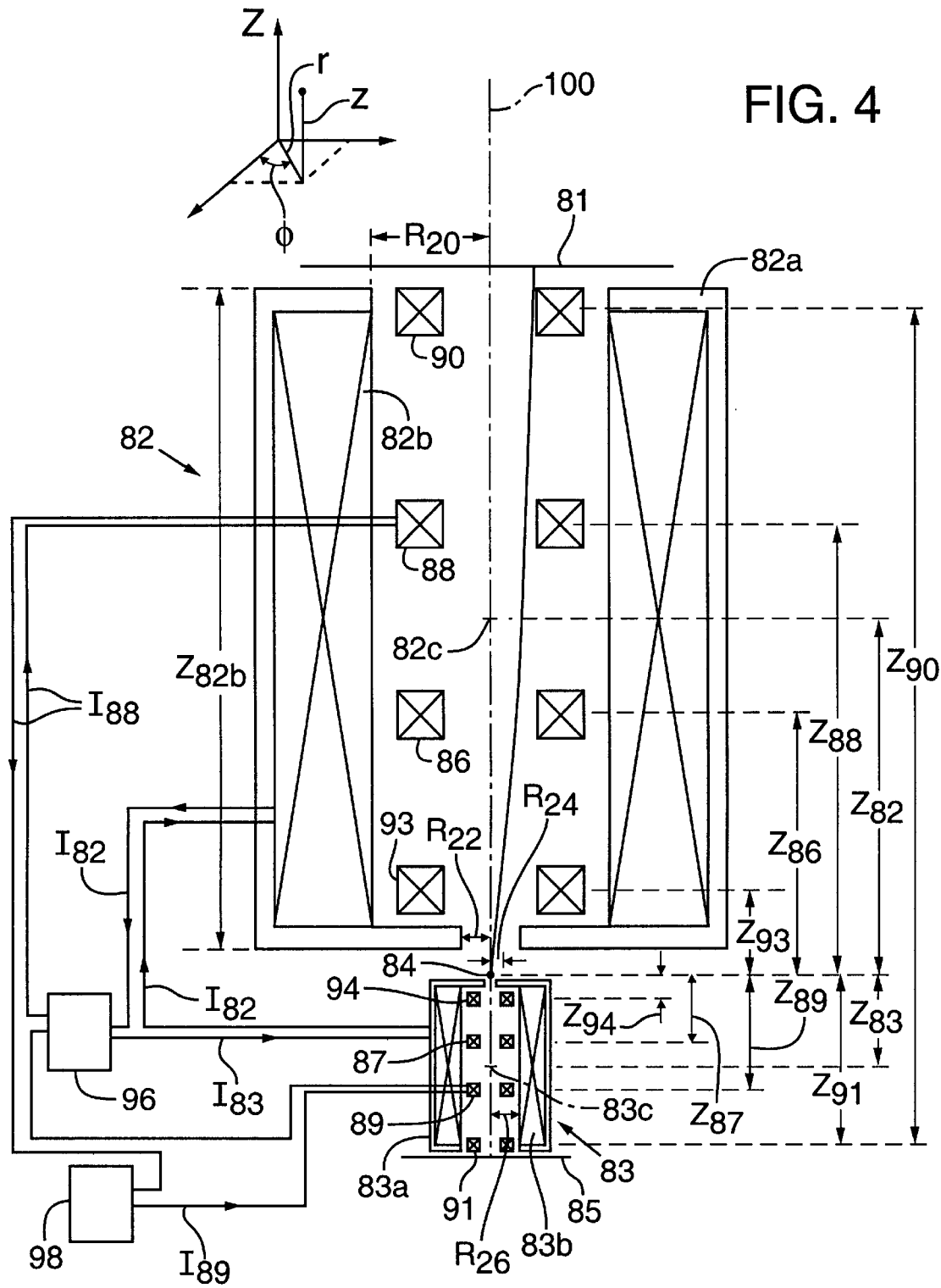
FIG. 4 is an elevational sectional view of a CPB optical system according to Example Embodiment 3.

With reference to FIG. 4, a CPB optical system according to Example Embodiment 3 projects an image of a subfield of a mask 81 onto a corresponding transfer subfield of a wafer 85 or other substrate. As shown in FIG. 4, the images are demagnified with a demagnification of 1/M=1/4. The mask 81 is divided into a plurality of fields each defining an integrated circuit pattern; each such pattern is four times larger on the mask 81 than the respective integrated circuit pattern formed on the wafer so that the projected pattern is the correct size after demagnification. Each field is further divided into subfields and one subfield is transferred to the wafer 85 in each exposure.

The CPB optical system comprises a first projection lens 82 having a pole piece 82*a* and a coil 82*b* and a second projection lens 83 having a pole piece 83*a* and a coil 83*b*. The object-wise bore radii of the pole pieces 82*a*, 83*a* are $R_{20}$, $R_{24}$, respectively; the image-wise bore radii of the pole pieces 82*a*, 83*a* are $R_{22}$, $R_{26}$, respectively. Centers 82*c*, 83*c* of the projection lenses 82, 83, respectively, are located along an optical axis 100 at respective distances $z_{82}$, $z_{83}$ from a crossover 84. The projection lenses 82, 83 form a symmetric magnetic doublet (SMD) and satisfy SMD conditions. The ratios of the bore radii $R_{20}/R_{26} = R_{22}/R_{24} = M$ and the ratio $z_{83}/z_{84} = M$. In general, the dimensions of the first projection lens 82 are M=4 times larger than the corresponding dimensions of the second projection lens 83. In addition, distances from the crossover 84 to corresponding features of the first projection lens 82 are M=4 times larger for the second projection lens 83. The ratio of the axial lengths of the pole pieces is $z_{82b}/z_{83b} = M$.

The bore radii $R_{22}$, $R_{20}$ of the first projection lens 82 are selected so that $R_{22} = R_{20}/2.5$. Similarly, the bore radii $R_{24}$, $R_{26}$ of the second projection lens 83 are selected so that $R_{24} = R_{26}/2.5$.

An electrical current $I_{82}$ is supplied to the coils 82*b*, 83*b* that produce the magnetic fields of the projection lenses 82, 83. The direction of the current $I_{82}$ is arranged so that the axial magnetic field components $B_z$ produced by the projection lenses 82, 83 are in opposite directions. A single power supply 96 supplies the current $I_{82}$ to the projection lenses 82, 83. Using the current $I_{82}$ from the power supply 96 in both the projection lenses 82, 83 in series reduces optical system variations caused by power-supply fluctuations. Individual power supplies can be used to produce currents for the projection lenses 82, 83, but power-supply variations may arise to cause chromatic aberration.

A set of object-wise deflectors 90, 88, 86, 93 are situated along the optical axis 100 near the lens 82 and between the mask 81 and the crossover 84. The deflectors 88, 86, 93 are located within the first projection lens 82 and the deflector 90 is located partially within the first projection lens 82. Each of the deflectors 90, 88, 86, 93 comprises a VAL subdeflector for creating an effective optical axis shifted from the optical axis 100, and a path subdeflector for deflecting the electron beam EB. (The VAL subdeflectors and path subdeflectors are not shown in FIG. 4) These subdeflectors cause a principal ray 92 to follow the respective effective optical axes from the mask 81 to the crossover 84.

A set of image-wise deflectors 94, 87, 89, 91 are situated from object-wise to image-wise along the optical axis 100 near the second projection lens 83 and between the crossover 84 and the wafer 85. The deflectors 94, 87, 89 are located within the second projection lens 83; the deflector 91 is located at the image-wise bore radius of the pole piece 83a. Each of the deflectors 94, 87, 89, 91 comprises a VAL subdeflector that creates a respective effective optical axis and a path subdeflector that deflects the electron EB received from the crossover 84 toward the transfer subfield on the wafer 91 corresponding to the selected subfield on the mask 81. These deflectors cause a principal ray to follow an effective optical axis from the crossover 84 to the wafer 85.

The individual deflectors 90, 92, 86, 93 correspond to the individual deflectors 91, 89, 87, 94, respectively. Axial distances of corresponding deflectors in each pair from the crossover 84 are symmetric with respect to the crossover 84. In particular, the ratios $z_{90}/z_{91}=z_{86}/z_{87}=z_{88}/z_{89}=z_{93}/z_{94}=M$. Corresponding pairs of deflectors (for example, the deflectors 88, 89) are connected to a common power supply 98 that supplies a series current $I_{88}$ to both deflectors in the pair. The remaining deflector pairs are similarly arranged so that a series current from a respective power supply is provided to the deflectors in each pair.

The CPB optical system of FIG. 4 is operated as follows. The optical axis of the lens 82 is shifted laterally from the optical axis 100 by a VAL magnetic field produced by the deflector 90, establishing an effective optical axis that intersects the center of a selected subfield of the mask 81. A principal ray 92 from the selected subfield of the mask 81 is parallel to the axis 100 at the mask 81. The principal ray 92 is deflected toward the axis 100 using the path subdeflector of the deflector 90. Near the deflector 88, the principal ray 92 is closer to the optical axis 100 than at the mask 81. The VAL subdeflector of the deflector 88 provides a magnetic field that shifts the effective optical axis further toward the axis 100; the path subdeflector of deflector 88 deflects the principal ray 92 toward the axis 100. The effective optical axis and the principal ray 92 are similarly shifted using the VAL subdeflectors and path subdeflectors of the deflectors 86, 93 so that the principal ray 92 is directed through the crossover 84. As a result, the effective optical axis as shifted by the VAL subdeflectors of the deflectors 90, 88, 86, 93 coincides with the principal ray 92.

The crossover 84 divides the axial distance between the mask 81 and the wafer 91 so that the ratio of the mask-to-crossover distance to the crossover-to-wafer distance is M=4. At the wafer 85, the principal ray 92 is perpendicular to the wafer 85 and parallel to the optical axis 100. In addition, the principal ray 92 intersects the center of the respective transfer subfield on the wafer 85 and is displaced one-quarter (1/M) of the radial distance from the optical axis 100 at which the principal ray 92 intersects the mask 81. The azimuth angles φ of the principal ray 92 at the mask 81 and the wafer 85 differ by 180°.

Example Embodiment 4

A CPB optical system according to Example Embodiment 4 is shown in FIG. 5. The CPB optical system of Example Embodiment 4 comprises the symmetric magnetic doublet (SMD) comprising the projection lenses 82, 83 of Example Embodiment 3. A first deflector 120, a VAL deflector 123, and aberration-correcting deflectors 116, 118 are provided in association with the first projection lens 82. A second deflector 121, a VAL deflector 124, and aberration-correcting deflectors 117, 119 are provided in association with the second projection lens 83. The deflectors 118, 116, 123 are situated from object-wise to image-wise along the optical axis 100 between the mask 81 and the crossover 84. The deflectors 124, 117, 119 are situated from object-wise to image-wise along the optical axis 100 between the crossover 84 and the wafer 91. Each of the first and second deflectors 120, 121, respectively, further comprises VAL subdeflectors and path deflectors that are not shown in FIG. 4.

The ratios of the dimensions of the corresponding pairs of deflectors (the deflector pairs are the aberration-correcting deflectors 116, 117, the aberration-correcting deflectors 118, 119, the first and second deflectors 120, 121, and the VAL deflectors 123, 124) are M=4. For each of these pairs of deflectors, the ratios of the axial distances of the object-wise deflector from the crossover 84 to the axial distance of the corresponding image-wise deflector to the crossover 84 is M=4. For example, the ratio of the distances $z_{118}$, $z_{119}$ for the deflectors 118, 119 is $z_{118}/z_{119}=4$.

Each pair of deflectors is connected to a respective power supply so that the electrical currents for the two deflectors are in series. For example, the aberration-correcting deflectors 118, 119 are driven by a power supply 128 that produces a current $I_{119}$. Because the current $I_{119}$ drives both the aberration-correcting deflectors 118, 119, variations in the electron-beam deflection produced by variations in the current $I_{119}$ due to, for example, noise in or poor regulation by the power supply 128 are reduced. Variations in the aberration-correcting deflector 118 tend to offset the variations in the aberration-correcting deflector 119.

A controller 130 selects a subfield of the mask 81 and adjusts the VAL subdeflector of the first deflector 120 to produce a magnetic field that establishes an effective optical axis of the first projection lens 82 intersecting the selected mask subfield. The path subdeflector of the first deflector 120 produces a deflection magnetic field so that a principal ray 112 coincides with the effective optical axis and intersects the crossover 84. The principal ray 112 is parallel to the axis 100 at the mask 81 and at the wafer 85. The remaining VAL deflectors shape the effective optical axis so that the principal ray 112 coincides with the respective optical axis.

The crossover 84 divides the mask-wafer distance so that the ratio of the distance from the mask 81 to the crossover 84 and the distance from the crossover 84 to the wafer 85 is M=4. The principal ray 112 is perpendicular to the mask 81 and the wafer 85.

When transferring a mask subfield using the CPB optical systems of the example embodiments, high-resolution patterns can be transferred with high throughput and with reduced sensitivity to variations in lens and deflector excitation. The optical systems of the example embodiments exhibit reduced levels of aberrations at high numerical apertures, even when used with large mask subfields. Because a principal ray of these optical systems coincides with an effective optical axis, off-axis aberrations are reduced or eliminated. In addition, deflection aberrations are reduced by providing corresponding object-wise and image-wise deflectors. The corresponding deflectors satisfy symmetry conditions, thereby reducing aberrations.

The CPB optical systems of the example embodiments preferably include deflectors comprising a VAL subdeflector and a path subdeflector so that a VAL magnetic field and a deflection field are produced. Such deflectors facilitate the reduction of aberrations. The optical systems of the example embodiments are also symmetric with respect to a crossover, thereby reducing aberrations and power supply fluctuations.

Superior performance is obtained if the image-wise bore diameter of the object-wise lens is less than or equal to 4/3 of the respective mask field diameter. By providing deflectors within a lens, the lens can extend along the optical axis, thereby reducing aberrations. By providing a plurality of deflectors, the effective optical axis and the principal ray can be gradually displaced, thereby reducing deflection aberrations. Superior results are obtained when at least three deflectors object-wise of the crossover and three deflectors image-wise of the crossover are used.

Because the deflectors object-wise and image-wise of the crossover 84 are paired and satisfy symmetry conditions concerning dimensions and placement, and are connected to a common series current, the effects of power-supply fluctuations are reduced. If, for example, the power supply (coil current) varies so that the electron beam EB receives a larger deflection in the +x-direction from the object-wise deflector, then the electron beam EB receives a larger deflection in the −x-direction from the image-wise deflector.

For example, by locating the deflector 120 at the object-wise bore of the lens 82 and using deflectors 128, 126, 123 to gradually deflect the electron beam EB along an a principal ray 112 that coincides with an effective optical axis, deflection aberrations are kept small.

Using corresponding deflector pairs, in which one deflector is object-wise of a crossover and one deflector is image-wise of a crossover, enables the reduction of optical system variations caused by variations in currents supplied to the deflectors. Using a plurality of deflectors permits the effective optical axis and the principal ray to be gradually deflected from the optical axis, thereby reducing aberrations.

In Example Embodiments 4–5, the respective magnetic fields of the first projection lens 82 and the second projection lens 83 are separated from each other by providing that the ratios of the bore diameters $R_{22}/R_{20} \geq 1/2$ and $R_{24}/R_{26} \geq 1/2$.

By providing a plurality of deflectors, deflection aberrations are reduced and the effects of power-supply fluctuations are reduced in proportion to $1/n^{1/2}$, where n is the number of deflectors.

The example embodiments described herein use an electron beam but it will be apparent that other charged-particle beams can be used. The example embodiments are also described having magnification factors M=3 and M=4, but the invention is not limited to these values. In addition, the example embodiments are illustrated as demagnifying (by 1/M<1) patterns from a mask onto a wafer. It will be apparent that optical systems according to the invention can be provided for magnifications 1/M>1 by exchanging the location of the object and image planes.

Having illustrated and demonstrated the principles of the invention in example embodiments, it should be apparent to those skilled in the art that the preferred embodiments can be modified in arrangement and detail without departing from such principles. I claim as the invention all that comes within the scope of the following claims.

What is claimed is:

1. A charged-particle-beam optical system for projecting patterns from a mask onto a sensitized substrate using a charged-particle beam, the optical system comprising, from object-wise to image-wise along an optical axis:

a condenser lens situated to receive a charged-particle beam and direct the charged-particle beam to the mask, the condenser lens producing a magnetic field;

a first projection lens situated to receive the charged-particle beam from the mask and form a crossover, the first projection lens producing a magnetic field, wherein on-axis axial components of the magnetic fields produced by the first projection lens and the condenser lens are in a first direction;

a crossover aperture situated at a crossover of the charged-particle beam;

a second projection lens situated to receive the charged-particle beam from the crossover aperture and direct the charged-particle beam to the sensitized substrate, the second projection lens producing a magnetic field;

an immersion lens situated so that the sensitized substrate is between the immersion lens and the second projection lens, the immersion lens producing a magnetic field, the on-axis axial components of the magnetic fields produced by the immersion lens and the second projection lens being in a second direction opposite to the first direction; and a plurality of deflectors situated along the optical axis between the mask and sensitized substrate, the deflectors being activatable to deflect the charged-particle beam and establish an effective optical axis, wherein a principal ray from an off-axis point on the mask coincides with the effective optical axis and passes through the center of the crossover aperture.

2. The charged-particle-beam optical system of claim 1, wherein the plurality of deflectors comprises equal numbers of deflect crossover and the mask and between the crossover and the sensitized substrate.

3. The charged-particle-beam optical system of claim 1, wherein the patterns are projected from the mask onto the sensitized substrate with a demagnification 1/M and a ratio of a distance from the mask to the crossover and a distance from the crossover to the wafer is M.

4. The charged-particle-beam optical system of claim 1, wherein a radial distance of the principal ray from the optical axis is a function R'(z) of an axial coordinate z such that r=R'(z) with the deflectors being activated, and a radial distance of the principal ray from the optical axis is a function R(z) of the axial coordinate z such that r=R(z) without the deflectors being activated, wherein R(z)=R'(z).

5. The charged-particle-beam optical system of claim 4, wherein an azimuthal angle coordinate of the principal ray is a function Φ'(z) of the axial coordinate z such that φ=Φ'(z) with the deflectors being activated, and an azimuthal angle coordinate of the principal ray is a function Φ(z) of the axial coordinate z such that φ=Φ(z) without the deflectors being activated, wherein Φ(z)=Φ'(z).

6. The charged-particle-beam optical system of claim 1, wherein the principal ray is perpendicular to the mask at the mask and perpendicular to the sensitized substrate at the sensitized substrate.

7. The charged-particle-beam optical system of claim 6, wherein the plurality of deflectors comprises equal numbers of deflectors between the crossover and the mask and between the crossover and the sensitized substrate.

8. The charged-particle-beam optical system of claim 6, wherein a radial distance of the principal ray from the optical axis is a function R(z) of an axial coordinate z such that r=R'(z) with the deflectors activated, and a radial distance of the principal ray from the optical axis is a function R(z) of the axial coordinate z such that r=R(z) without the deflectors activated, wherein R(z)=R'(z).

9. The charged-particle-beam optical system of claim 1, further comprising a current source, wherein the first projection lens and the second projection lens receive a series current from the current source.

10. The charged-particle-beam optical system of claim 1, wherein the patterns are projected from the mask onto the sensitized substrate with a demagnification 1/M, and a principal plane of the first projection lens and a principal plane of the second projection lens are offset by distances M$\Delta$z and $-\Delta$z, respectively, from symmetric magnetic doublet (SMD) positions.

11. The charged-particle-beam optical system of claim 10, wherein a ratio of a distance from the mask to the crossover and a distance from the crossover to the sensitized substrate is M.

12. The charged-particle-beam optical system of claim 1, wherein the first projection lens and the second projection lens form a symmetric magnetic doublet.

13. A charged-particle-beam optical system for transferring a pattern from a mask to a wafer at a demagnification of 1/M, the system comprising, from object-wise to image-wise along an optical axis:

a first lens and a second lens, the first lens forming a crossover, wherein a ratio of axial distances from the mask to the crossover and from the crossover to the wafer is M;

a set of object-wise deflectors, situated along the optical axis between the mask and the crossover, comprising at least K deflectors, wherein K$\geq$1;

a set of image-wise deflectors, situated along the optical axis between the crossover and the wafer, comprising K deflectors, the image-wise deflectors and the object-wise deflectors establishing an effective optical axis displaced from the axis; and the object-wise and image-wise deflectors being operable such that respective deflection aberrations produced by the deflectors approximately cancel the aberrations produced by the first lens and the second lens.

14. The charged-particle-beam optical system of claim 13, wherein a principal plane of the first lens and a principal plane of the second lens are offset by distances M$\Delta$z and $-\Delta$z, respectively, from symmetric magnetic doublet positions.

15. The charged-particle-beam optical system of claim 14, wherein an axial distance between object-wise and image-wise bores of the first lens is less than or equal to two times the larger of object-wise and image-wise bore diameters of the first lens.

16. The charged-particle-beam optical system of claim 15, wherein an axial distance between object-wise and image-wise bores of the second lens is less than or equal to two times the larger of the object-wise and image-wise bore diameters of the second lens.

17. The charged-particle-beam optical system of claim 13, wherein:

the first lens comprises a pole piece having object-wise and image-wise bore diameters;

the second lens comprises a pole piece having object-wise and image-wise bore diameters; and the bore diameters of the first lens are no larger than twice the diameter of a mask field, and the bore diameters of the second lens are no larger than twice the diameter of a respective transfer field.

18. The charged-particle-beam optical system of claim 17, wherein an axial distance between object-wise and image-wise bores of the second lens is less than or equal to two times the larger of object-wise and image-wise bore diameters of the second lens.

19. The charged-particle-beam optical system of claim 13, further comprising a current source, wherein at least one deflector of the object-wise set and at least one deflector of the image-wise set receive a series current from the current source.

20. The charged-particle-beam optical system of claim 13, further comprising a current source, wherein the first lens and the second lens receive a series current from the current source.

21. The charged-particle-beam optical system of claim 20, wherein the object-wise deflectors comprise, from object-wise to image-wise, deflectors 1 through K and the image-wise deflectors comprise, from image-wise to object-wise, deflectors 1 through K, wherein a Jth object-wise deflector and a Jth image-wise deflector (1$\leq$J$\leq$K) are symmetric.

22. The charged-particle-beam optical system of claim 21, wherein K$\geq$3.

23. The charged-particle-beam optical system of claim 21, further comprising a current source connected to the Jth object-wise deflector and the Jth image-wise deflector, whereby the currents supplied by the current source to the Jth object-wise deflector and the Jth image-wise deflector are equal in magnitude and produce oppositely directed deflections.

24. The charged-particle-beam optical system of claim 21, wherein:

the first lens comprises a pole piece having object-wise and image-wise bore diameters;

the second lens comprises a pole piece having object-wise and image-wise bore diameters;

the mask is divided into mask fields and the wafer is divided into respective transfer fields; and the bore diameters of the pole piece of the first lens are no larger than twice the diameter of a mask field, and the bore diameters of the pole piece of the second lens are no larger than twice the diameter of the respective transfer field.

25. The charged-particle-beam optical system of claim 24, wherein the object-wise bore diameter of the first lens is less than or equal to 1.5 times the image-wise bore diameter of the first lens.

26. The charged-particle-beam optical system of claim 20, wherein:

each of the first and second lenses has a lens bore, receives a lens excitation, and produces a magnetic field; and further wherein the bores, the lens excitations, and the magnetic fields of the first and second lenses satisfy symmetric magnetic doublet conditions.

27. The charged-particle-beam optical system of claim 20, wherein the image-wise bore diameter of the second lens is less than or equal to 1.5 times the object-wise bore diameter of the second lens.

28. The charged-particle-beam optical system of claim 27, wherein an axial distance between the object-wise and image-wise bore diameters of the first lens is less than or equal to two times the larger of the object-wise and image-wise bore diameters of said first lens.

29. The charged-particle-beam optical system of claim 27, wherein an axial distance between the object-wise and image-wise bores of the second lens is less than or equal to two times the larger of the object-wise and image-wise bore diameters of said second lens.

30. The charged-particle-beam optical system of claim 29, wherein K$\geq$3.

31. A charged-particle-beam optical system for transferring a pattern from a subfield of a mask to a corresponding transfer subfield of a wafer with a demagnification of 1/M using a charged-particle beam, the system comprising, from object-wise to image-wise along an optical axis:

a first projection lens comprising a pole piece having an object-wise bore and an image-wise bore, the first projection lens forming a crossover;

a crossover aperture situated at the crossover, wherein a ratio of an axial distance from the mask to the crossover and an axial distance from the crossover to the wafer is M;

a second projection lens comprising a pole piece having an object-wise bore and an image-wise bore, wherein either a ratio of an object-wise bore diameter of the first projection lens and an image-wise bore diameter of the second projection lens is M, or a ratio of an axial length of the pole piece of the first projection lens to an axial length of the pole piece of the second projection lens is M; and an object-wise set of N deflectors situated between the mask and the crossover aperture, the deflectors generating respective magnetic fields establishing an effective optical axis and deflecting the charged-particle beam so that an off-axis principal ray coincides with the effective optical axis and intersects the center of the crossover aperture, wherein aberrations generated by the lens are canceled by aberrations generated by the deflectors.

32. The charged-particle-beam optical system of claim 31, further comprising:

an image-wise set of N deflectors situated between the crossover aperture and the wafer, the image-wise set of deflectors generating respective magnetic fields establishing an effective optical axis and deflecting the charged-particle beam so that an off-axis principal ray coincides with the effective optical axis and intersects the center of the crossover aperture;

a current source; and wherein an Nth-most object-wise deflector of the object-wise set of N deflectors and an Nth-most image-wise deflector of the image-wise set of N deflectors receive a series current from the current source.

33. A charged-particle-beam optical system for transferring respective patterns from subfields of a mask onto corresponding transfer subfields on a wafer using a charged-particle beam and with a demagnification 1/M, the system comprising:

a first projection lens having an object-wise bore diameter and an image-wise bore diameter, the first projection lens forming a crossover, wherein a ratio of an axial distance from the mask to the crossover and from the crossover to the wafer is M;

a second projection lens having an object-wise bore diameter and an image-wise bore diameter and situated to receive the charged-particle beam from the crossover, wherein a ratio of the object-wise bore diameter of the first projection lens to the image-wise bore diameter of the second projection lens is M, a ratio of the image-wise bore diameter of the first projection lens to the object-wise bore diameter of the second projection lens is M, and a ratio of axial distances between lengths of the first and second projection lenses is M;

a first deflector situated object-wise of the first projection lens and producing a magnetic field that establishes an effective optical axis, and producing a magnetic field that deflects the charged-particle beam so that an off-axis principal ray from a mask subfield intersects the crossover and coincides with the effective optical axis;

an object-wise set of J (where $J \geq 2$) deflectors comprising, from object-wise to image-wise deflectors 1, . . . , J, the J deflectors being situated between the first deflector and the crossover and generating a magnetic field establishing an effective optical axis that coincides with the principal ray; and an image-wise set of J' (wherein $J' \geq 2$) deflectors comprising, from image-wise to object-wise, deflectors 1, . . . , J', the J' deflectors being situated between the crossover and the wafer and generating a magnetic field establishing an effective optical axis that coincides with the principal ray.

34. The charged-particle-beam optical system of claim 33, wherein each of the deflectors of the object-wise set of J deflectors is operable to produce a nearly equal deflection.

35. The charged-particle-beam optical system of claim 33, wherein each of the deflectors of the image-wise set of J' deflectors is operable to produce a nearly equal deflection.

36. The charged-particle-beam optical system of claim 33, wherein J=J'.

37. The charged-particle-beam optical system of claim 33, further comprising a current source and wherein each of the first projection lens and the second projection lens receives a series current from the current source.

38. The charged-particle-beam optical system of claim 33, wherein a principal plane of the first projection lens and a principal plane of the second projection lens are offset by distances $M \Delta z$ and $-\Delta z$, respectively, from symmetric magnetic doublet (SMD) positions.

39. The charged-particle-beam optical system of claim 33, wherein:

the image-wise bore diameter of the first projection lens is less than one-half the object-wise bore diameter of the first projection lens; and the object-wise bore diameter of the second projection lens is less than one-half the image-wise bore diameter of the second projection lens.

40. The charged-particle-beam optical system of claim 39, wherein J=J'.

41. The charged-particle-beam optical system of claim 40, wherein an Nth-most object-wise deflector of the object-wise set and an Nth-most image-wise deflector of the image-wise set are situated so that a ratio of respective axial distances of said deflectors from the crossover is M, or a ratio of respective axial lengths of said deflectors is M.

42. The charged-particle-beam optical system of claim 40, wherein an Nth-most object-wise deflector of the object-wise set and an Nth-most image-wise deflector of the image-wise set have diameters, and a ratio of the respective diameters is M.

43. The charged-particle-beam optical system of claim 40, further comprising a current source, wherein an at least one object-wise deflector of the object-wise set and an at least one image-wise deflector of the image-wise set receive a series current from the current source.

44. The charged-particle-beam optical system of claim 43, wherein the Nth-most object-wise deflector of the object-wise set and the Nth-most image-wise deflector of the image-wise set have respective Ampere-turns values produced by the current source, wherein the Ampere-turns values are equal and opposite to each other.

45. A charged-particle-beam optical system for transferring patterns from subfields of a mask onto corresponding transfer subfields on a wafer with a demagnification 1/M and using a charged-particle beam, the system comprising:

a first projection lens having an object-wise bore diameter and an image-wise bore diameter, the first projection lens forming a crossover, wherein a ratio of an axial distance from the mask to the crossover and from the crossover to the wafer is M, and wherein the image-wise bore diameter of the first projection lens is less than one-half the object-wise bore diameter of the first projection lens;

a second projection lens having an object-wise bore diameter and an image-wise bore diameter and situated to receive the charged-particle beam from the crossover, wherein a ratio of the object-wise bore diameter of the first projection lens to the image-wise bore diameter of the second projection lens and a ratio of the image-wise bore diameter of the first projection lens to the object-wise bore diameter of the second projection lens are each M, a ratio of axial distances between lengths of the first and second projection lenses is M, and the object-wise bore diameter of the second projection lens is less than one-half the image-wise bore diameter of the second projection lens;

a first deflector situated object-wise of the first projection lens and producing a magnetic field that establishes an effective optical axis and a magnetic field that deflects the charged-particle beam so that an off-axis principal ray from a mask subfield intersects the crossover and coincides with the effective optical axis;

an object-wise set of J (where J≧2) variable-axis lens (VAL) deflectors comprising, from object-wise to image-wise, VAL deflectors 1, ..., J, situated between the first deflector and the crossover and generating a magnetic field establishing an effective optical axis that coincides with the principal ray, each of the deflectors of the object-wise set being operable to produce an equal deflection;

an image-wise set of J' (where J'≧2) variable-axis lens (VAL) deflectors comprising, from image-wise to object-wise, VAL deflectors 1, ..., J', situated between the crossover and the wafer and generating a magnetic field establishing an effective optical axis that coincides with the principal ray, each of the deflectors of the image-wise set being operable to produce an equal deflection; and wherein each of the object-wise VAL deflectors 1, ..., J of the object-wise set and the corresponding 1, ..., J' deflectors of the image-wise set have respective diameters, the ratios of the corresponding diameters and axial distances from the crossover are each M, and at least one pair of corresponding deflectors receives a respective common series current.

46. A charged-particle-beam optical system for projecting patterns from a mask onto a sensitized substrate using a charged-particle beam, the optical system comprising, from object-wise to image-wise along an optical axis:

a condenser lens situated to receive a charged-particle beam and direct the charged-particle beam to the mask, the condenser lens producing a magnetic field having an on-axis axial component in a first direction;

a first projection lens situated to receive the charged-particle beam from the mask and form a crossover, the first projection lens producing a magnetic field having an on-axis axial component in a second direction opposite the first direction;

a crossover aperture situated at a crossover of the charged-particle beam;

a second projection lens situated to receive the charged-particle beam from the crossover aperture and direct the charged-particle beam to the sensitized substrate, the second projection lens producing a magnetic field having an on-axial component in the first direction;

an immersion lens situated so that the sensitized substrate is situated between the immersion lens and the second projection lens, the immersion lens producing a magnetic field having an on-axis axial component in the second direction; and a plurality of deflectors situated along the optical axis between the mask and sensitized substrate, the deflectors being activatable to deflect the electron beam and establish an effective optical axis, wherein a principal ray from an off-axis point on the mask coincides with the effective optical axis and passes through the center of the crossover aperture.

47. A method for transferring a pattern from an off-axis subfield of a mask to a corresponding transfer subfield on a wafer or other substrate using a charged-particle beam and two or more magnetic lenses, the method comprising:

providing a deflection magnetic field in each lens to deflect the charged-particle beam along a principal ray; and using a series current to provide a variable axis magnetic field to establish an effective optical axis of each of the lenses that coincides with the principal ray.

48. The method of claim 47, including the step of providing at least one pair of deflectors, each deflector in the pair being associated with a respective magnetic lens, and energizing the deflectors using a common series current.

* * * * *

UNITED STATES PATENT AND TRADEMARK OFFICE
CERTIFICATE OF CORRECTION

PATENT NO.    : 6,064,071
DATED         : May 16, 2000
INVENTOR(S)   : Nakasuji

It is certified that error appears in the above-identified patent and that said Letters Patent is hereby corrected as shown below:

Column 5,
Line 42, change " 1,..., J. and" to -- 1,..., J. --.

Column 6,
Line 7, change "to least one" to -- to at least one --.
Lines 39 and 41, change "$B_z(0,\phi z)$" to -- $B_z(0,\phi,z)$ --.

Column 8,
Line 1, change "respective comprise" to -- comprise respective --.
Line 5, change "current in image-wise coil" to -- current in the image-wise coil --.

Column 9,
Line 42, change "14-19, i.e.," to -- 14-19; i.e., --.

Column 10,
line 5, change "FIGS. 1(*d*)" to -- FIG. 1(*d*) --.

Column 13,
Line 8, change "FIG. 4) These" to -- FIG. 4). These --.

Column 15,
Line 26, change "along an a principal" to -- along a principal --.

UNITED STATES PATENT AND TRADEMARK OFFICE
CERTIFICATE OF CORRECTION

PATENT NO.    : 6,064,071
DATED         : May 16, 2000
INVENTOR(S)   : Nakasuji

It is certified that error appears in the above-identified patent and that said Letters Patent is hereby corrected as shown below:

CLAIMS:

Column 16,
Line 28, change "of deflect" to -- of deflectors between the --.

Signed and Sealed this

Twenty-first Day of August, 2001

*Attest:*

*Attesting Officer*

NICHOLAS P. GODICI
*Acting Director of the United States Patent and Trademark Office*